(12) United States Patent
Gomes et al.

(10) Patent No.: US 12,327,581 B2
(45) Date of Patent: Jun. 10, 2025

(54) EMBEDDED MEMORY IC'S WITH POWER SUPPLY DROOP CIRCUITRY COUPLED TO FERROELECTRIC CAPACITORS

(71) Applicant: Intel Corporation, Santa Clara, CA (US)

(72) Inventors: Wilfred Gomes, Portland, OR (US); Abhishek Anil Sharma, Portland, OR (US); Uygar Avci, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 583 days.

(21) Appl. No.: 17/558,440

(22) Filed: Dec. 21, 2021

(65) Prior Publication Data

US 2023/0197135 A1    Jun. 22, 2023

(51) Int. Cl.
| | |
|---|---|
| *G11C 11/22* | (2006.01) |
| *H01L 23/48* | (2006.01) |
| *H01L 23/528* | (2006.01) |
| *H10B 53/30* | (2023.01) |
| *H10B 53/40* | (2023.01) |

(52) U.S. Cl.
CPC ........ *G11C 11/2297* (2013.01); *G11C 11/221* (2013.01); *H01L 23/481* (2013.01); *H01L 23/5286* (2013.01); *H10B 53/30* (2023.02); *H10B 53/40* (2023.02)

(58) Field of Classification Search
None
See application file for complete search history.

(56) References Cited

U.S. PATENT DOCUMENTS

| | | | |
|---|---|---|---|
| 6,643,162 B2* | 11/2003 | Takeuchi | G11C 11/22 365/65 |
| 11,640,834 B2* | 5/2023 | Jayapal | H02M 1/0093 365/226 |
| 2005/0152202 A1* | 7/2005 | Choi | G11C 5/145 365/226 |
| 2006/0146592 A1* | 7/2006 | Lee | G11C 11/22 365/145 |

* cited by examiner

*Primary Examiner* — Tan T. Nguyen
(74) *Attorney, Agent, or Firm* — Essential Patents Group, LLP

(57) ABSTRACT

Integrated circuits with embedded memory that includes ferroelectric capacitors having first conductor structures coupled to an underlying array of access transistors, and second conductors coupled to independent plate lines that are shunted by a metal strap having a pitch similar to that of the capacitors. The independent plate lines may reduce bit-cell disturbs and/or simplify read/write process while the plate line straps reduce series resistance of the plate lines. The metal straps may be subtractively patterned lines in direct contact with the second capacitor conductors, or may be damascene structures coupled to the second capacitor conductors through vias that also have a pitch similar to that of the capacitors.

20 Claims, 9 Drawing Sheets

EMBEDDED MEMORY IC'S WITH POWER SUPPLY DROOP CIRCUITRY COUPLED TO FERROELECTRIC CAPACITORS

BACKGROUND

Embedded memory is monolithically integrated into host integrated circuitry (i.e., both memory and the host circuitry fabricated on the same die or chip). One embedded memory architecture is DRAM based on a 1T-1C cell that includes a "write," "select" or "access" transistor and a storage capacitor. An array of such bit-cells may be integrated with host logic circuitry, such as a host microprocessor chip (e.g., a central processing unit or "CPU" core). Integration of both a capacitor memory device and a processor proximate to one another in a same IC chip, for example, enables communication between the memory device and the processor through a chip bus capable of higher bandwidths and/or lower signal latencies relative to packaged IC chips communicating through package interconnects.

A transistor and a capacitor of each 1T-1C cell may be electrically coupled through one or more metal interconnect layers formed in the back-end-of-line (BEOL) over logic circuitry formed in the front-end-of-line (FEOL). The BEOL is the portion of IC fabrication where individual semiconductor devices (whether embedded memory or logic transistors) are interconnected to one another with metal interconnect traces (lines) within a given metallization level and metal vias between multiple metallization levels. These conductive interconnects are embedded in a dielectric material so that the memory device is a monolithic integrated circuit.

In conventional embedded DRAM (eDRAM), each capacitor comprises an insulative dielectric material separating charge stored on capacitor conductors. An embedded memory architecture may rely on the application of a voltage to one capacitor conductor with the other conductor held at some reference (e.g., ground). In a ferroelectric embedded DRAM (FeDRAM), each capacitor comprises a ferroelectric material. An embedded memory architecture may then rely on polarization states of a capacitor's ferroelectric material, which can be changed when an electric field applied across the capacitor conductors is of correct polarity and sufficient strength to alter the semi-permanent dipoles within the ferroelectric material. A given polarization state may be sensed by measuring an amount of charge needed to flip the ferroelectric capacitor to an opposite polarity state. The read cell may then be subsequently rewritten to the previous polarization state to retain the ascertained bit value. An embedded FeDRAM memory architecture therefore needs to apply a voltage to each capacitor conductor relative to the other to sense and rewrite an individual bit-cell.

Host circuitry of an IC with embedded memory may experience workload variations that lead to supply-voltage droops. Such supply droops can significantly degrade the performance of microprocessor circuitry when voltage droop detection and/or correction circuitry monitors for supply voltage droops and takes a corrective action, like temporarily clocking-down, for example according to some clock-skipping algorithm. Accordingly, embedded memory IC architectures, and the fabrication techniques associated with those architectures, which can reduce the severity of supply voltage droop are commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1A:
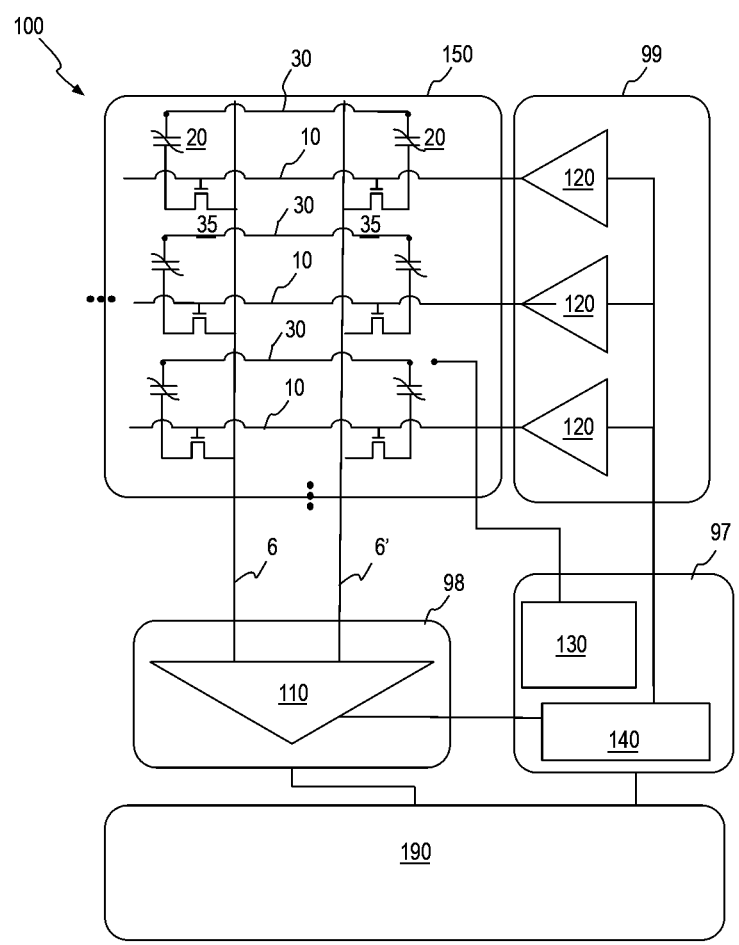
FIG. 1A illustrates a schematic of an integrated circuit (IC) with embedded memory including ferroelectric (FE) capacitors, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

The term "adjacent" here generally refers to a position of a thing being next to (e.g., immediately next to or close to with one or more things between them) or adjoining another thing (e.g., abutting it).

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause-and-effect relationship).

The terms "over," "under," "between," and "on" as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

The term "signal" may refer to at least one current signal, voltage signal, magnetic signal, or data/clock signal.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

As used throughout this description, and in the claims, a list of items joined by the term "at least one of" or "one or more of" can mean any combination of the listed terms.

Unless otherwise specified in the explicit context of their use, the terms "substantially equal," "about equal" or "approximately equal" mean that there is no more than incidental variation between two things so described. In the art, such variation is typically no more than +/−10% of a predetermined target value.

FIG. 1 is a schematic illustrating an IC 100 with embedded memory, in accordance with some embodiments. In this macro-view, a memory array 150 includes a 2D array of storage capacitors 20 networked with conductive traces including multiple bitlines 6 and 6' (reference), as well as multiple wordlines 10 and multiple capacitor plate lines 30. Memory array 150 further includes a select/access transistor 35 electrically coupled to each storage capacitor 20. Memory array 150 is fabricated in the BEOL interconnect levels of IC 100. Hence, all of capacitors 20, bitlines 6, 6', wordlines 10, select transistors 35 and plate lines 30 are fabricated within, and/or between, various interconnect metallization levels.

Peripheral memory circuitry including at least one of column circuitry 98 and row circuitry 99 may be located at a device level that falls within at least some of the footprint of memory array 150. For example, bitlines 6, 6' may be electrically coupled to a sense amplifier 110. In further embodiments, wordlines 10 are electrically coupled to wordline drivers 120.

Peripheral memory circuitry further includes control circuitry 97. One or more of column circuitry 98, and/or row circuitry 99, and/or memory array 150 may be electrically coupled to control circuitry 97. Control circuitry 97 may include, for example, various voltage biasing circuits, such as capacitor bias circuitry 130 that includes a charge pump that can be coupled to individual ones of a plurality of top capacitor plate lines 30. Rather than one plate of the storage capacitors being tied together across many wordlines and many bitlines, for example by a continuous sheet of capacitor conductor, capacitor conductors are separated into subset populations with each subset of capacitors being associated with either one bitline or with one wordline. In the example illustrated in FIG. 1, plate lines 30 run parallel to wordlines 10 so that a plate of each capacitor 20 coupled to one wordline 10 is tied to one plate line 30. In alternative examples, for example as described further below, plate lines 30 may instead run parallel to bitlines 6 so that a plate of each capacitor 20 coupled to one bitline 6 is tied to one plate line 30. Regardless of the plate line configuration, the subset of capacitors that are electrically coupled by one capacitor plate line 30 may be coupled to a charge pump to reverse bias ferroelectric capacitors 20. Capacitor bias circuitry 130 may therefore have as many outputs as bitlines or wordlines for a given memory array. Each plate line configuration has some advantages and disadvantages. For example, in the embodiment illustrated in FIG. 1, disturbs are minimized. In the alternative embodiment, disturbs are higher but the read/write process is simplified by biasing the plate voltage.

Control circuitry 97 may also include, for example, various memory management circuitry, such as control logic 140 communicatively coupled into column circuitry 98 and row circuitry 99 so as to permit coordinated operation of sense amplifier 110 and wordline driver 120. Control circuitry 97 may also be fabricated in a device level the falls within the footprint of memory array 150. Control circuitry 97 may, for example, also employ MOSFETs fabricated in a region of a monocrystalline semiconductor device layer (e.g., silicon substrate) that is at least partially underlying memory array 150.

IC 100 further includes host logic circuitry 190. Host logic circuitry 190 is a primary consumer of memory bandwidth supplied by memory array 150. Host logic circuitry 190 may be any application specific IC (ASIC) including one or more IP cores. In some embodiments, host logic circuitry 190 comprises a processor core. In other embodiments, host logic circuitry 190 comprises any of a wireless radio circuit, or floating point gate array (FPGA).

In exemplary embodiments, memory array 150 comprises a 2D array of metal-ferroelectric-metal (MFM) capacitors 20 fabricated over a corresponding array of the access transistors 35. In exemplary embodiments, the individual memory cells/bit-cells include one access transistor 35 and one ferroelectric capacitor 20 (1T-1F). Ferroelectric materials can have higher values of relative permittivity than dielectric materials. Charge capacitance for a given MFM capacitor area can therefore be larger for a ferroelectric material than for a dielectric material, and include switching capacitance associated with biasing and reverse biasing the capacitor conductors to modulate the semi-permanent dipoles within the ferroelectric material. The ferroelectric material may be deposited by chemical vapor deposition, and more specifically atomic layer deposition (ALD), at temperatures compatible with BEOL structures.

FE-capacitors 20 may occupy a footprint over a substrate including logic circuitry including field effect transistors (FETs), for example implementing the peripheral circuitry as described above. CMOS FET circuitry implementing host logic circuitry 190 may be adjacent to the footprint of memory array 150. Access transistors 35 providing wordline and bitline access to the FE-capacitors may reside within the BEOL substantially within the footprint of the FE-capacitor array.

For some exemplary embodiments, access transistor 35 of a 1T-1F storage cell is a thin-film transistor (TFT) rather than a monocrystalline silicon-based transistor (e.g., MOSFET). TFTs are a class of field-effect transistors (FETs) in which the channel material is a deposited thin film rather than a monocrystalline material. The thin film deposition processes employed in TFT fabrication can be relatively low temperature (e.g., below 450° C.), allowing TFTs to be inserted within layers of interconnect metallization of the type that is typically formed only after higher-temperature MOSFET processing is completed in conventional silicon MOSFET fabrication technology. TFTs can be made using a wide variety of semiconductor materials, such as silicon, germanium, silicon-germanium, as well as various oxide semiconductors (a.k.a. semiconducting oxides) including metal oxides like indium gallium zinc oxide (IGZO), indium zinc oxide (IZO), and the like.

The access transistor 35 of a 1T-1F storage cell may alternatively be a recessed channel array transistor (RCAT). RCATs are a class of field-effect transistors (FETs) in which the gate is recessed into the channel material. Recession into the channel increases the effective channel length of the transistor without increasing the transistor footprint, allowing access transistor 35 to have an area matched to that of an overlying ferroelectric capacitor 20.

As described further below, the ferroelectric material employed within the memory array 150 may be leveraged in one or more capacitors coupled to power supply rails of IC 100 that are further configured to discharge when power supply rail voltage droop is detected. Hence, the ability to deploy ferroelectric capacitors within memory array 150 may be further exploited as a means of improving the performance of host circuitry that experiences workload variations and concomitant supply voltage droop.

Figure 1B:
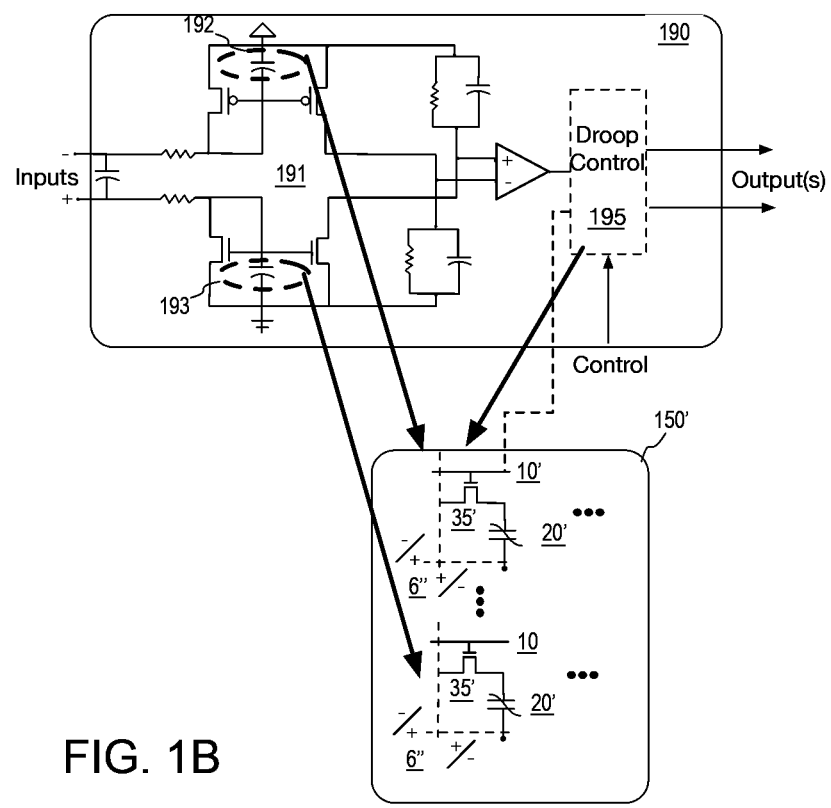
FIG. 1B illustrates a schematic of an integrated circuit (IC) with embedded memory and one or more FE capacitors coupled to power supply circuitry, in accordance with some embodiments.

FIG. 1B illustrates a schematic of host circuitry 190 with power supply circuitry 191, in accordance with some embodiments. As shown, power supply circuitry 191 includes positive and negative input supply rails. The input rails pass through RC filters that include filter capacitors 192 and 193. In accordance with some embodiments herein, filter capacitors 192 and 193 are replaced with ferroelectric capacitors, for example having the same ferroelectric material in that of 1T-1F memory bit-cells in the embedded memory. As represented by the arrows, filter capacitors 192, 193 may be directly replaced with any number of 1T-1F bit-cells in a bit-cell array structure portion 150'. Rather than interconnected into a memory cell array structure (e.g., 150 in FIG. 1A), the bit-cell array structure portion 150' switchably interconnects ferroelectric capacitors 20' through line 6" to a first power rail (e.g., – or +) when power supply circuitry 191 is in an ordinary non-droop condition, and switchably interconnects ferroelectric capacitors 20' through line 6" to the other power rail (e.g., + or –) when power supply circuitry 191 is in a droop condition. Switching between the supply rails ensures polarization of ferroelectric capacitors 20' is reset during ordinary operations so that polarization switching current is available to stabilize the supply voltage during droop conditions. For specific embodiments, where a ferroelectric capacitor is ordinarily coupled to a + rail (e.g., replacing filter capacitor 192), a first conductor of ferroelectric capacitor 20' is biased up by the + rail during ordinary operation, while the other conductor is, for example, grounded. During a droop condition, the first conductor of ferroelectric capacitor 20' is biased down by the – rail, while the other conductor is, for example, grounded. Similarly, where a ferroelectric capacitor is ordinarily coupled to a – rail (e.g., replacing filter capacitor 193), a first conductor of ferroelectric capacitor 20' is biased down by the – rail during ordinary operation, while the other conductor is, for example, grounded. During the droop condition, the first conductor of ferroelectric capacitor 20' is biased up by the + rail, while the other conductor is, for example, grounded. Because of their polarization, terminals of ferroelectric capacitors need to be actively switched between the power supply rails, switching their polarity with each instance of rail voltage droop to discharge them and counter the voltage droop.

In accordance with some embodiments, ferroelectric capacitors may be actively switched between power supply rails, for example in the manner described above, by a droop detection circuit. As further illustrated in FIG. 1B, a droop detection and/or control circuit 195 is coupled to one or more ferroelectric capacitors that are switchable between the power supply rails in response to detecting a droop condition. Many droop detection circuits are known, and embodiments herein are not limited to any particular circuit topology. Droop circuit 195 is to detect a drop in supply voltage, and then initiate the discharge of one or more ferroelectric capacitors, for example by controlling a gate of the access transistors 35' after switching the supply rails to proper ones of the conductors of ferroelectric capacitors 20' that will reverse the polarity of capacitors 20'. In addition to controlling the switching of filter capacitors 192, 193, droop control circuitry 195 may include any number of other ferroelectric capacitors 20 coupled to power supply rails in various other circuit topologies.

Ferroelectric capacitors for supply voltage droop mitigation may be integrated into an IC die further including embedded memory that also employs ferroelectric capacitors. The two applications of ferroelectric capacitors may be synergistically integrated where the two types of capacitors share at least the same ferroelectric material. Hence, the ability to fabricate ferroelectric capacitors in an embedded 1T-1F DRAM array structure may be further leveraged within the same IC die to reduce voltage transients in the power supply to host circuitry of the IC die. As described further below the ferroelectric capacitors for supply voltage droop mitigation may be implemented in either the front end of line or back end of line.

Figure 2:
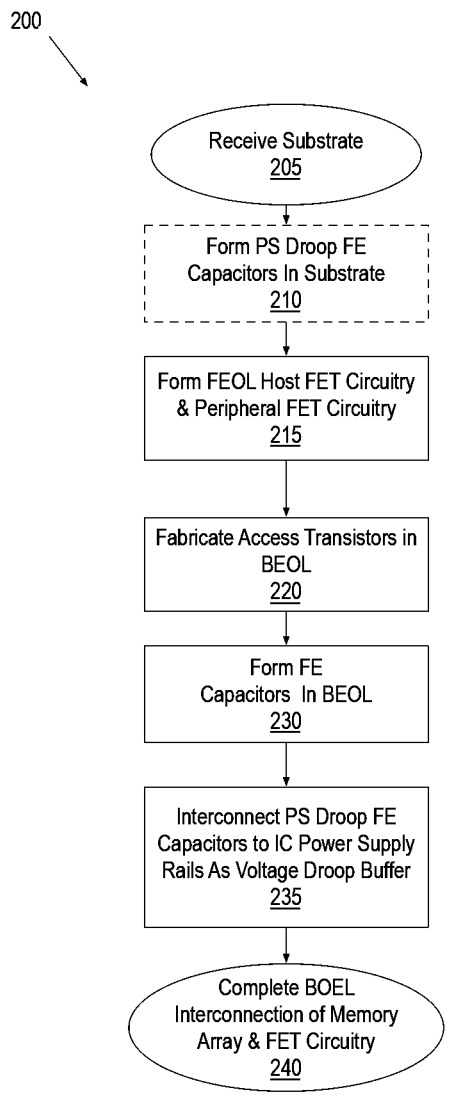
FIG. 2 is a flow diagram illustrating methods of fabricating the IC illustrated in FIGS. 1A and 1B, in accordance with some embodiments.
Figure 3A:
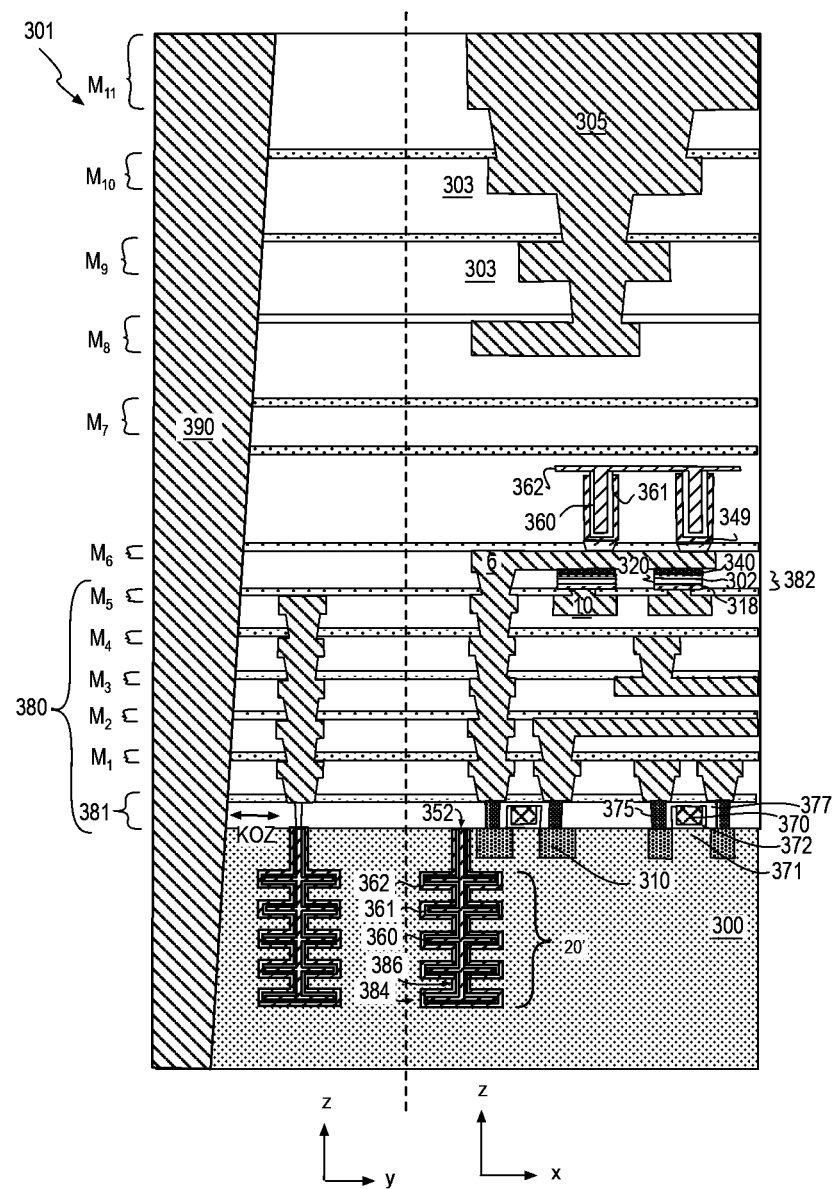
FIG. 3A illustrates a first cross-sectional side view of the IC illustrated in FIGS. 1A and 1B, in accordance with some embodiments including a power supply MFM capacitor.
Figure 4:
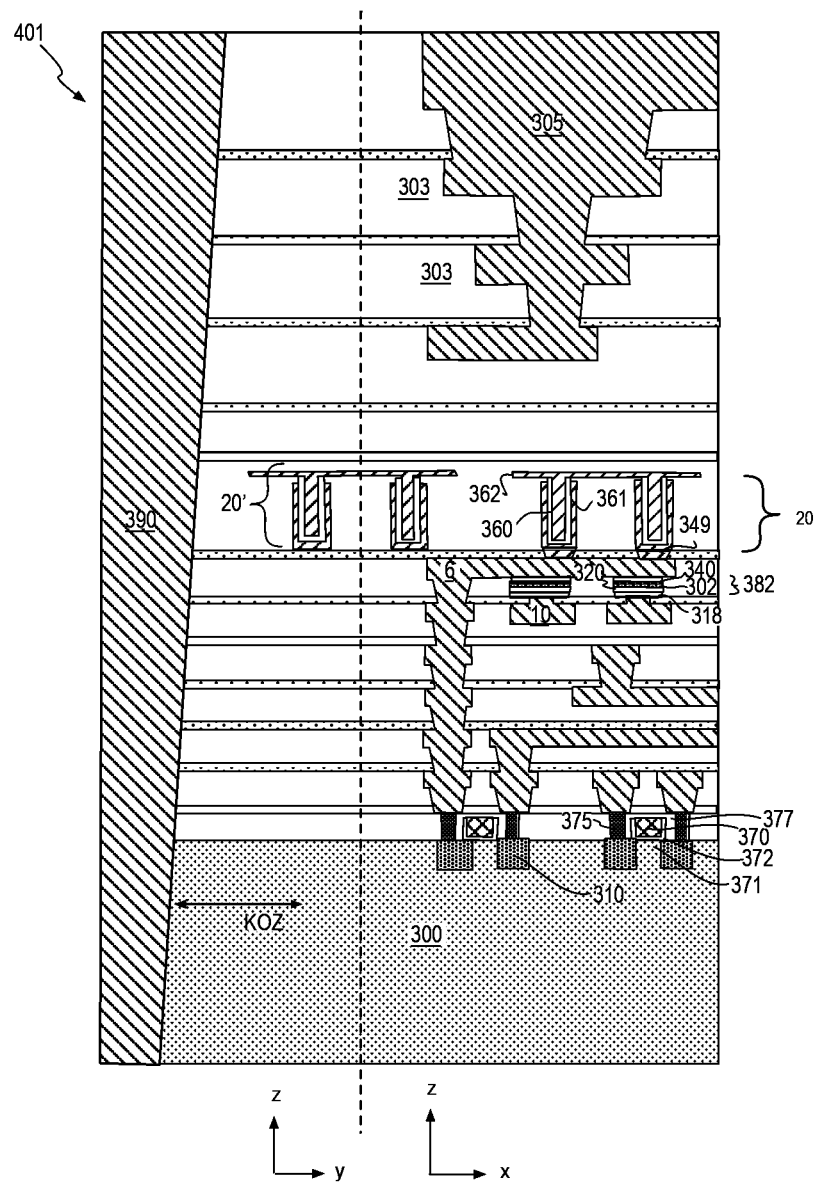
FIG. 4 illustrates orthogonal cross-sectional side views of the IC illustrated in FIGS. 1A and 1B, in accordance with some alternative embodiments including power supply MFM capacitors co-planar with a memory capacitor array structure.
Figure 5:
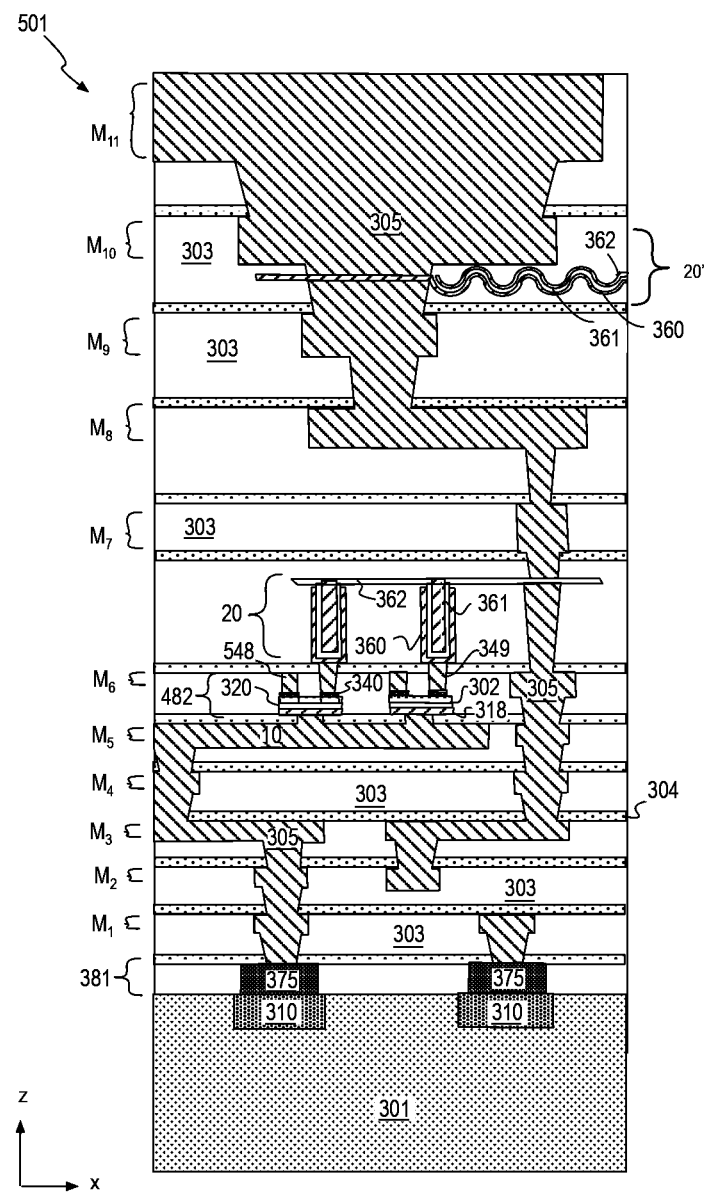
FIG. 5 illustrates orthogonal cross-sectional side views of the IC illustrated in FIGS. 1A and 1B, in accordance with some alternative embodiments including power supply MFM capacitors embedded within a substrate.

FIG. 2 is a flow diagram illustrating methods 200 for fabricating IC 100 (FIG. 1), in accordance with some embodiments. FIGS. 3A, 4 and 5 illustrate cross-sectional side views of exemplary IC structures including ferroelectric capacitors for supply voltage droop mitigation that may be fabricated according to methods 200. In FIG. 3A, IC structure 301 is an exemplary implementation of IC 100 in accordance with some embodiments with a ferroelectric power supply droop capacitor located below an embedded memory array, and more specifically within a monocrystalline substrate. In FIG. 4, IC structure 401 is an exemplary implementation of IC 100 in accordance with some embodiments with a ferroelectric power supply droop capacitor co-planar with an embedded memory array. In FIG. 5, IC structure 501 is an exemplary implementation of IC 100 in accordance with some embodiments with a ferroelectric power supply droop capacitor located over an embedded memory array.

As shown in FIG. 2, methods 200 begin at input 205 where an input substrate is received. FIG. 3A illustrates two orthogonal cross-sectional views separated by a vertical dashed line. Left of the dashed line is a cross-sectional view along the z-y plane and a cross-sectional view along the z-x plane is to the right of the dashed line. In this example, the input substrate 300 comprises a monocrystalline semiconductor material such as, but not limited to, predominantly silicon (e.g., substantially pure Si) material, predominantly germanium (e.g., substantially pure Ge) material, or a compound material comprising a Group IV majority constituent (e.g., SiGe alloys, GeSn alloys). In other embodiments, substrate 300 is a Group III-N material comprising a Group III majority constituent and nitrogen as a majority constituent (e.g., GaN, InGaN). Other embodiments are also possible, for example where substrate 300 is a Group III-V material comprising a Group III majority constituent and a Group IV majority constituent (e.g., InGaAs, GaAs, GaSb, InGaSb).

Returning to FIG. 2, methods 200 continue at block 210. Block 210 is optional as denoted by dashed lines, and is practiced to embed a ferroelectric power supply droop capacitor within the substrate. Various deep via capacitor fabrication techniques may be practiced at block 210. FIG. 3A illustrates one example of an ultra MFM structure comprising a via 352 that is first etched into substrate 300. Substrate 300 includes multiple material bi-layers. Each bi-layer may have, for example, different impurity dopings (e.g., n-type and p-type bi-layers). In other embodiments, each bi-layer comprises differing amounts of Ge (e.g., $Si_xG_{1-x}$ and Si bi-layers). The bi-layer structure is exploited by selectively recess etching one type of layer of each bi-layer exposed by via 352. Sidewalls of via 352 are therefore expanded to a larger diameter 384 for one of the substrate layers that is etched more than another of the substrate layers that defines a smaller via diameter 386. The resulting undulating sidewalls of via 352 are then lined with a first capacitor conductor 360, a ferroelectric material 361, and a second capacitor conductor 362 to form a substrate-embedded ferroelectric power supply droop capacitor 20'.

Although the composition of the capacitor conductors 360, 362 and intervening ferroelectric material 361 may vary with implementation, in exemplary embodiments at least ferroelectric material 361 has substantially the same composition as the ferroelectric material of a memory array structure embedded within IC 301. In further embodiments, capacitor conductors 360, 362 and intervening ferroelectric material 361 may all have substantially the same composition, and be deposited by the same technique, as their counterparts in a capacitor of memory array structure embedded within IC 301.

Figure 3B:
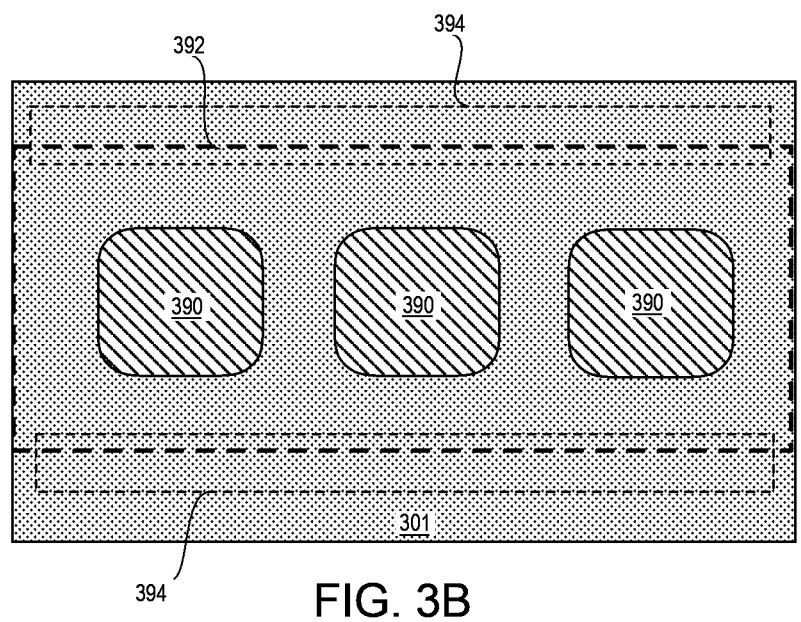
FIG. 3B illustrates a plan view of power supply MFM capacitors located proximal to keep-out-zone surrounding through-substrate vias in an IC with embedded memory, in accordance with some embodiments.

As shown in left portion of FIG. 3A, IC 301 includes a through-substrate via (TSV) 390 passing through substrate 300, FEOL 380, and all BEOL metallization levels. TSV 390 may have any dimensions and composition known to be suitable for TSVs. As shown FIG. 3A, and as further illustrated in the plan view shown in FIG. 3B, a keep-out zone 392 surrounds TSVs 390. TSV Keep-out zone 392 is a region where no FEOL circuitry or memory array structures are fabricated to allow for variation in the placement and dimensioning of TSVs 390. In accordance with some further embodiments, ferroelectric power supply droop capacitors are located more proximal to TSV keep-out zone 392 than any of the ferroelectric memory array capacitors. As further illustrated in FIG. 3B, ferroelectric power supply droop capacitors may be positioned within two spatial regions 394 along opposite sides of the TSV keep-out zone 392. In accordance with some embodiments, and as further shown in FIG. 3A, substrate embedded ferroelectric power supply droop capacitor 20' may be, at least partially, within TSV keep-out zone 392.

Returning to FIG. 2, methods 200 continue at block 215 where FEOL fabrication processes are practiced to form host (e.g., ASIC) logic circuitry and embedded memory peripheral FET circuitry. Any FEOL process(es) may be practiced at block 215. In the example illustrated in FIG. 3A, FEOL circuitry 380 includes peripheral logic circuitry of an embedded memory that includes field effect transistors (FETs) 381. Although not depicted, CMOS FETs implementing host integrated circuitry that further includes droop detection circuitry may be anywhere laterally adjacent to the peripheral logic circuitry of the embedded memory, but within the same plane as FETs 381.

FETs 381 employ monocrystalline semiconductor material for at least the channel semiconductor 371. FETs 381 further include a gate terminal 370 separated from channel semiconductor 371 by a gate insulator 372. Channel semiconductor 371 separates semiconductor terminals 310

(source semiconductor and drain semiconductor). Contact metallization 375 lands on semiconductor terminals 310 and is separated from gate terminal 370 by an intervening insulator 377. FETs 381 may be planar or non-planar devices. In some advantageous embodiments, FETS 381 are finFETs.

FEOL circuitry 380 further includes one or more initial levels of interconnect metallization 305 embedded in dielectric material 303. In the exemplary embodiment illustrated, FEOL circuitry 380 includes metal-one ($M_1$), metal-two ($M_2$) metal-three ($M_3$), and metal-four ($M_4$) levels interconnecting FETs 381. In the example, metal-five implements wordline 10.

Returning to FIG. 2, methods 200 continue at block 220 where access transistors are fabricated over the FEOL circuitry, within a BEOL layer. In some embodiments, block 220 comprises fabricating TFTs. The TFTs may be planar channel devices, fin channel devices, or recessed channel devices. In the example illustrated in FIG. 3, a plurality of TFTs 382 is located over FEOL circuitry 380. As shown, all TFTs 382 employ portions of thin film semiconductor layer 302, which is an amorphous or polycrystalline film that may extend across, and/or between, all TFTs 382, or comprise a plurality of physically separated islands. Individual ones of TFTs 382 include a gate terminal (electrode) 318 separated from semiconductor layer 302 by a gate dielectric 320. In the exemplary embodiment illustrated, TFTs 382 are "bottom-gate" devices with semiconductor layer 302 deposited over gate terminal 318. Alternatively, top-gate architectures are also possible where at least gate terminal 318 is above semiconductor layer 302. Terminal contact metallization 340 lands on source and drain regions of semiconductor layer 302.

Semiconductor layer 302 may be a group IV semiconductor material, such as silicon (Si), germanium (Ge), and SiGe alloys. However, in some exemplary embodiments, semiconductor layer 302 comprises an oxide semiconductor, or semiconducting oxide, or a semiconductor, comprising a metal and oxygen. Many metal oxide semiconductor materials have a wide band gap oxide channel material offering low leakage. With essentially no minority carriers, majority-minority carrier recombination cannot generate significant off-state leakage current. Through low-leakage, TFTs 382 may enable higher retention rates at higher memory density and enhance the performance of a 1T-1F cell further including a ferroelectric capacitor.

An oxide semiconductor thin film can be amorphous (i.e., having no structural order), or polycrystalline (e.g., having micro-scale to nano-scale crystal grains). Exemplary metal oxides include a transition metal (e.g., IUPAC group 4-10) or post-transition metal (e.g., IUPAC groups 11-15). In advantageous embodiments, the metal oxide includes at least one of Mg, Cu, Zn, Sn, Ti, Ni, Ga, In, Sb, Sr, Cr, Co, V, or Mo. The metal oxides may be suboxides ($A_2O$), monoxides (AO), binary oxides ($AO_2$), ternary oxides ($ABO_3$), and mixtures thereof.

Semiconductor layer 302 may be a p-type, n-type, or intrinsic material. In exemplary embodiments, semiconductor layer 302 is n-type as many oxide semiconductors have been found to be capable of significant electron densities. In some embodiments, semiconductor layer 302 comprises a tin oxide ($SnO_x$), such as Tin (IV) oxide, or $SnO_2$. In other embodiments, the tin oxide is Tin (II) oxide (SnO) or a mixture of SnO and $SnO_2$, where x may range between 1 and 2. While the range of x may be expanded, semiconducting properties may be lost (e.g., the material becomes a pure conductor if x is to low, and a pure insulator if x is too high).

In some other embodiments, semiconductor layer 302 comprises a zinc oxide ($ZnO_x$), such as Zn(II) oxide, or ZnO. In other embodiments, the zinc oxide is zinc dioxide ($ZnO_2$) or a mixture of ZnO and $ZnO_2$, where x may range between 1 and 2. In some other embodiments, semiconductor layer 302 comprises titanium oxide ($TiO_x$), or $SnO_x$.

Semiconductor layer 302 or various portions thereof, may be intentionally doped, or not. Compared to intrinsic oxide semiconductor that is not intentionally doped, n-type and p-type oxide semiconductors may have a higher concentration of impurities, such as, but not limited to, one or more group III element, group V element, and/or elemental hydrogen (H), and/or oxygen vacancies. In some embodiments where semiconductor layer 302 comprises $ZnO_x$, the dopants may include In and Ga. In some specific examples, semiconductor layer 302 is $InGaO_3(ZnO)_5$, often referred to simply as IGZO.

Returning to FIG. 2, methods 200 continue at block 230 where FE memory capacitors are formed within a BEOL level over the cell access transistors. At block 230, ferroelectric material is formed on at least one sidewall of a capacitor conductor. As shown in FIG. 3A, each storage node interconnect metallization 349 electrically couples a first conductive capacitor plate conductor 360 to a semiconductor terminal (e.g., source semiconductor) of one access transistor. FE capacitors 20 further include another plate conductor 362 that is separated from conductor 360 by an intervening ferroelectric material 361. The same reference numbers are employed for the FE memory capacitors as for the power supply droop capacitor 20' to emphasize the layer compositions may be substantially the same.

In the exemplary embodiment shown, conductor 362 is continuous across at least all FE capacitors 20 associated with one bitline 6. In alternative embodiments, capacitor conductor 362 may also be continuous across FE capacitors 20 associated with multiple bitlines, but a single wordline. Although conductors 360 and 362 may have any composition known to be suitable for a storage capacitor, in exemplary embodiments, the compositions are ones that can be deposited by ALD for the sake of high conformality. In some embodiments, conductors 360 and 362 are both of the same metal or metallic compound, with some examples being Ti, $TiN_x$.

Ferroelectric material 361 advantageously has a higher relative permittivity than high-K dielectric materials that lack the spontaneous polarization of materials in a ferroelectric phase (orthorhombic, non-centrosymmetric crystallinity). For example, a high-k dielectric comprising predominantly hafnium and oxygen ($HfO_x$), but not in a ferroelectric phase, may have a relative permittivity in the range of 10-14. However, hafnium oxide in a ferroelectric phase may have a relative permittivity exceeding 25 (e.g., 30). Although in both instances the $HfO_x$ comprises predominantly hafnium and oxygen, ferroelectric material 361 is more specifically a ferroelectric phase of the hafnium oxide. Such phases may be achieved, for example, through the addition of a dopant, such as silicon, germanium, aluminum, or yttrium. Although doped ferroelectric $HfO_x$ is an exemplary embodiment that can be advantageously conformally deposited by ALD, ferroelectric material 361 may also have other compositions similarly amenable to being deposited at temperatures compatible with BEOL structures and with similar thickness conformality.

In exemplary embodiments where the memory capacitor conductors are substantially cylindrical (e.g., a right cylinder that is open at the top), ferroelectric material 361 lines at least an interior sidewall of the cylinder. Following a deposition of capacitor conductor 362, a subtractive etch process may be utilized to pattern capacitor conductor 362 into separated plate lines running parallel to one of wordline 10 or the bitline 6.

Returning to FIG. 2, methods 200 continue at block 235 where the FE power supply droop capacitors are interconnected with power supply rails of the IC. Where the power supply rails are implemented in upper levels of BEOL metallization, for example in metal 9 ($M_9$), or above, the FE power supply droop capacitors are interconnected to upper levels of BEOL metallization through intermediate routing metallization levels. In the example shown in FIG. 3A, FE power supply droop capacitor 20' are coupled to metallization within FEOL circuitry 380 and any switching between power supply rails may be performed by FEOL FETs 381.

Returning to FIG. 2, methods 200 end at output 240 where BEOL interconnect of the embedded memory array and/or the underlying FET circuitry is completed. For example, as shown in FIG. 3A, metallization levels M8-M11 may be fabricated over the embedded memory array and droop capacitors 20'.

In accordance with some alternative embodiments, FE power supply droop capacitors may be fabricated co-planar with FE capacitors of a memory array. FIG. 4 illustrates orthogonal cross-sectional side views of an IC structure 401, which is a portion of the IC 100 illustrated in FIGS. 1A and 1B, in accordance with some exemplary embodiments. In FIG. 4, reference numbers from FIG. 3A are retained for structures that may have any of the same properties described for like structures introduced in IC structure 301. As shown in FIG. 4, IC structure 401 shares many of the features of IC structure 301, including FEOL circuitry 380 and ferroelectric memory capacitors 20. However, instead of being embedded within substrate 300, ferroelectric power supply droop capacitors 20' are substantially co-planar with memory capacitors 20.

As illustrated in FIG. 4, droop capacitors 20' have substantially the same structure as memory capacitors 20. Hence, both droop capacitors 20' and memory capacitors 20 may be cylindrical, comprise the same material layers, and may be fabricated concurrently. In some examples, droop capacitors 20' are an edge portion of a memory array structure that is interconnect differently than the remainder of the memory array structure. In the illustrated embodiment, droop capacitors 20' are between TSV 390 and memory capacitors 20. Droop capacitors 20' may again be at the edge of the TSV keep-out zone (KOZ), or even at least partially within the TSV KOZ.

Although not illustrated in FIG. 4, droop capacitors 20' may be coupled to TFTs 482 in substantially the same manner as depicted for memory capacitors 20, in which case the corresponding TFTs 482 may be interconnected to power supply droop detection circuitry implemented with FEOL circuitry to activate a charging or discharging of the droop capacitors 20' from power supply rails.

In accordance with some alternative embodiments, FE power supply droop capacitors may be fabricated over the FE capacitors of a memory array, at higher levels of BEOL metallization. FIG. 5 illustrates a cross-sectional side view of an IC structure 501 along the x-z plane, which is a portion of the IC 100 illustrated in FIGS. 1A and 1B, in accordance with some exemplary embodiments. In FIG. 5, reference numbers from FIG. 3A are retained for structures that may have any of the same properties described for like structures introduced in IC structure 301.

As shown in FIG. 5, IC structure 501 shares many of the features of IC structure 301, including FEOL circuitry 380 and ferroelectric memory capacitors 20. However, ferroelectric power supply droop capacitors 20' are located between metallization level $M_9$ and $M_{10}$. Although droop capacitors 20' may be planar MFM stacks, in the illustrated example, capacitor conductor 360 conformally follows undulating topography of dielectric material 303. The undulating topography is to increase surface area of capacitor conductor 360 to be larger than it's footprint over substrate 300. Topography may be formed within dielectric material 303 according to a variety of techniques, such as, but not limited to, a patterned etch process. Ferroelectric material 361 and capacitor 360 conformally follow the undulating topography of capacitor conductor 360.

As illustrated in FIG. 5, droop capacitors 20' may be fabricated following a damascene process practiced to fabricate metallization level $M_9$. Each of capacitor conductor 360, ferroelectric material 361, and capacitor conductor 362 may be subtractively etched, or otherwise patterned, before continuing with additional damascene processing to completed BEOL metallization levels $M_{10}$ and $M_{11}$.

For embodiments where droop capacitors 20' are in an upper metallization level over memory capacitors 20, droop capacitors 20' may again be located within a periphery near TSV 390 (e.g., along the x-axis somewhere between TSV 390 and memory capacitors 20. Droop capacitors 20' may be at the edge of the TSV keep-out zone (KOZ), or even at least partially within the TSV KOZ.

FIG. 5 further illustrates thin film access transistors coupled to a memory device bitline in a view orthogaonl to that shown in FIG. 3 and FIG. 4. As for IC structures 301 and 401, in IC structure 501 (FIG. 5), TFTs 382 are below an interconnect metallization trace within a BEOL metallization level $M_6$. Memory device bitline may alternatively comprise an interconnect metallization within a metallization level $M_5$, below TFTs 382. As further shown, metal line 548 provides a bitline connection to contact metallization 340 landing on semiconductor terminals (e.g., drain semiconductor) of access transistors. Source terminals of access transistors are electrically connected to capacitor storage nodes through interconnect metallization 349. Storage node interconnect metallization 349 is adjacent to, but electrically insulated from, the bitline, and in this example includes a $M_6$ line and an overlying via.

Figure 6:
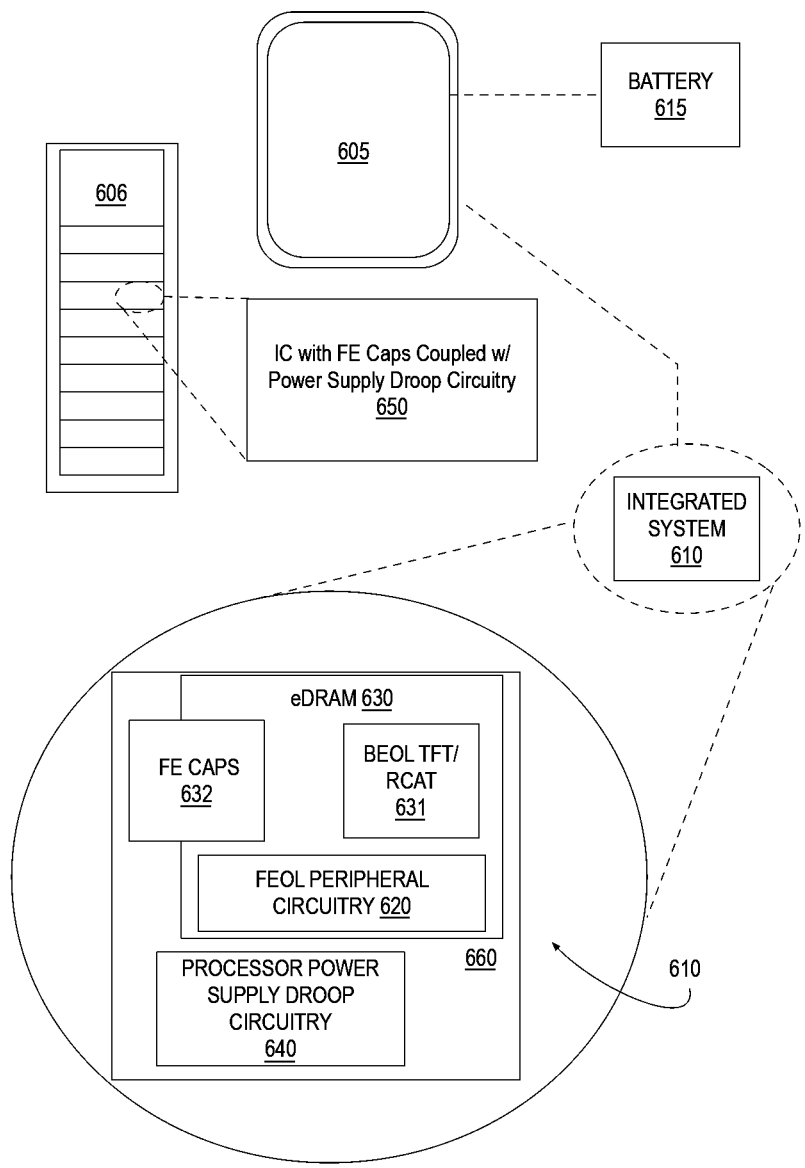
FIG. 6 illustrates a mobile computing platform and a data server machine employing an IC with embedded memory including power supply MFM capacitors, in accordance with some embodiments.

FIG. 6 illustrates a mobile computing platform 605 and a data server machine 606 employing one or more integrated circuits with embedded memory that includes first FE capacitors, and power supply droop circuitry coupled to second FE capacitors, for example as described elsewhere herein. Server machine 606 may be any commercial server, for example including any number of high-performance computing platforms disposed within a rack and networked together for electronic data processing, which in the exemplary embodiment includes one or more integrated circuits 650 with embedded memory that includes first FE capacitors, and power supply droop circuitry coupled to second FE capacitors, for example as described elsewhere herein. The mobile computing platform 605 may be any portable device configured for each of electronic data display, electronic data processing, wireless electronic data transmission, or the like. For example, the mobile computing platform 605 may be any of a tablet, a smart phone, laptop computer, etc., and may include a display screen (e.g., a capacitive, inductive, resistive, or optical touchscreen), an integrated system 610, and a battery 615.

As illustrated in the expanded view 610, a monolithic IC 660 includes FEOL processor circuitry 640 and eDRAM 630. eDRAM 630 further includes FEOL peripheral circuitry 620, BEOL TFT/RCAT access transistors 631, and FE capacitors 632 coupled to FEOL processor power supply droop circuitry 640, for example as described elsewhere herein.

Figure 7:
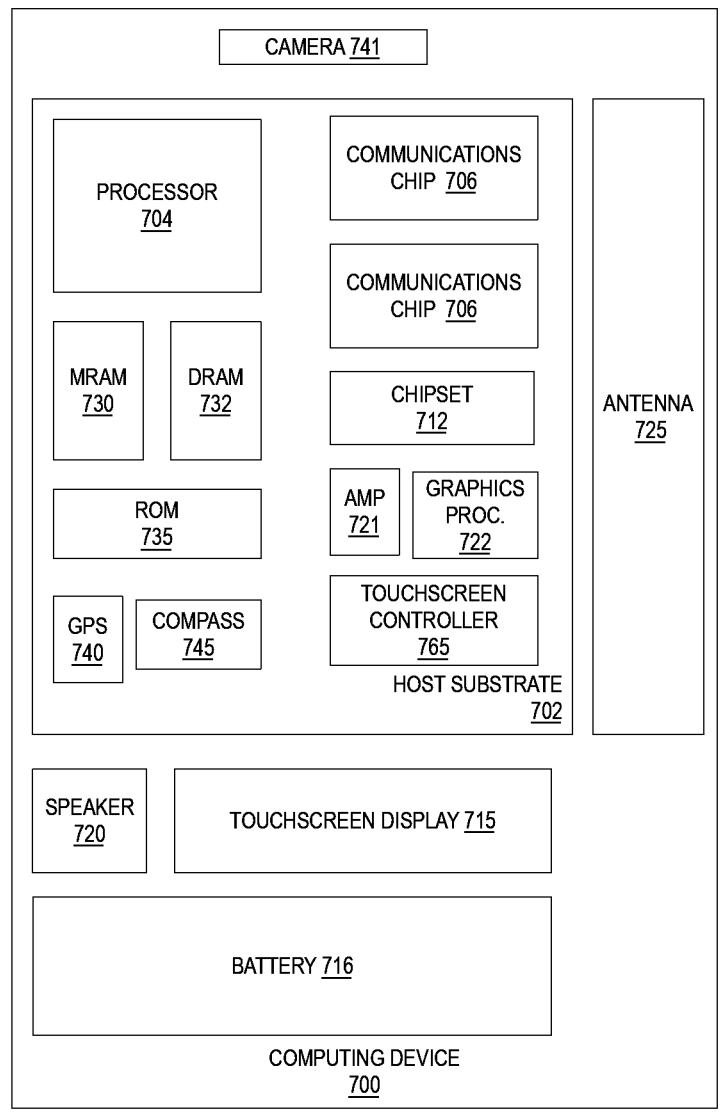
FIG. 7 is a functional block diagram of an electronic computing device, in accordance with some embodiments.

FIG. 7 is a functional block diagram of an electronic computing device 700, in accordance with an embodiment of the present invention. Computing device 700 may be found inside either mobile platform 605 or server machine 606, for example. Device 700 further includes a host substrate 702 hosting a number of components, such as, but not limited to, a processor 704 (e.g., an applications processor). Processor 704 may be physically and/or electrically coupled to host substrate 702. In some examples, processor 704 comprises one or more integrated circuits with embedded memory that includes first FE capacitors, and power supply droop circuitry coupled to second FE capacitors, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 706 may also be physically and/or electrically coupled to the host substrate 702. In further implementations, communication chips 706 may be part of processor 704. Depending on its applications, computing device 700 may include other components that may or may not be physically and electrically coupled to host substrate 702. These other components include, but are not limited to, volatile memory (e.g., DRAM 732), non-volatile memory (e.g., ROM 735), flash memory (e.g., NAND or NOR), magnetic memory (MRAM 730), a graphics processor 722, a digital signal processor, a crypto processor, a chipset 712, an antenna 725, touchscreen display 715, touchscreen controller 765, battery 716, audio codec, video codec, power amplifier 721, global positioning system (GPS) device 740, compass 745, accelerometer, gyroscope, speaker 720, camera 741, and mass storage device (such as hard disk drive, solid-state drive (SSD), compact disk (CD), digital versatile disk (DVD), and so forth), or the like. In some exemplary embodiments, at least one of the components of device 700 comprises one or more integrated circuits with BEOL FE capacitors and TFT or RCAT access transistors vertically integrated with FEOL logic circuitry, for example as described elsewhere herein.

Communication chips 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 706 may implement any of a number of wireless standards or protocols. As discussed, computing device 700 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example, the above embodiments may include specific combinations of features as further provided below.

In first examples, an integrated circuit (IC) die comprises host circuitry comprising first transistors, wherein the host circuitry comprises power supply droop detection circuitry to detect supply voltage droop across power supply rails of the IC die. The IC die comprises an embedded memory array structure coupled to the host circuitry. The embedded memory array structure comprises a plurality of first capacitors, each of the first capacitors comprising a first conductor and a second conductor with a ferroelectric material therebetween. The embedded memory array structure comprises a plurality of second transistors, wherein a first terminal of each of the second transistors is connected to the first conductor, a second terminal of the second transistors is coupled to one of a plurality of bitlines, and a third terminal of the second transistors is coupled to one of a plurality of wordlines. The IC die comprises a plurality of second capacitors with conductors coupled to the power supply rails.

In second examples, for any of the first examples the second capacitors each comprise the ferroelectric material and are to be charged into a first polarization, and discharged into a second opposite polarization in response to supply voltage droop.

In third examples, for any of the first through second examples individual ones of the second capacitors are coupled to corresponding ones of third transistors, wherein a first terminal of each of the third transistors is connected to a first conductor of the second capacitors, a second terminal of each of the third transistors is connected to one of the supply rails, a third terminal of each of the third transistors is coupled to the droop detection circuitry and a second conductor of the second capacitors is coupled to another of the supply rails.

In fourth examples, for any of the third examples the first conductor of the second capacitors is over a dielectric material having undulating topography and first conductor conformally follows the undulating topography.

In fifth examples, for any of the first through third examples, the IC die further comprises one or more first levels of metallization over the first transistors. The memory array structure is over the first levels of metallization, the plurality of second transistors is between the first capacitors and the first levels of metallization, and the second capacitors are over the memory array structure.

In sixth examples, for any of the first through fifth examples, the IC die further comprises one or more first levels of metallization over the first transistors. The memory array structure is over the first levels of metallization. The plurality of second transistors is between the first capacitors and the first levels of metallization. The second capacitors are co-planar with the first capacitors.

In seventh examples, for any of the sixth examples the first and second capacitors have substantially the same cylindrical structures.

In eighth examples, for any of the first through seventh examples the IC die comprises a substrate under the first transistors, and a through-substrate via (TSV) extending through the substrate and adjacent to the first and second transistors and adjacent to the first and second capacitors.

In ninth examples, for any of the eighth examples the second capacitors are more proximal to the TSV than the first capacitors.

In tenth examples, for any of the first through ninth examples, the IC die comprises a substrate under the first transistors, one or more first levels of metallization over the first transistors. The memory array structure is over the first levels of metallization. The plurality of second transistors is between the first capacitors and the first levels of metallization. The second capacitors are embedded within the substrate.

In eleventh examples, for any of the ninth through tenth examples the second capacitors are more proximal to the TSV than the first capacitors.

In twelfth examples, for any of the first through eleventh examples the ferroelectric material has a relative permittivity over 25 and comprises predominantly Hf, O, and one or impurity dopants that comprise at least one of Si or Ge.

In thirteenth examples, for any of the first through twelfth examples a channel material of the second transistors comprises predominantly one or more metals and oxygen.

In fourteenth examples a system comprises an integrated circuit (IC) die comprising host circuitry comprising first transistors. The host circuitry comprises power supply droop detection circuitry to detect supply voltage droop across power supply rails of the IC die. The IC die comprises an embedded memory array structure coupled to the host circuitry. The embedded memory array structure comprises a plurality of first capacitors, each of the first capacitors comprising a first conductor and a second conductor with a ferroelectric material therebetween and a plurality of second transistors. A first terminal of each of the second transistors is connected to the first conductor, a second terminal of the second transistors is coupled to one of a plurality of bitlines, and a third terminal of the second transistors is coupled to one of a plurality of wordlines. The IC die comprises a plurality of second capacitors with conductors switchably coupled to the power supply rails. The second capacitors each comprise the ferroelectric material and are to be charged into a first polarization, and discharged into a second opposite polarization in response to supply voltage droop. The system comprises a power supply coupled to power the IC die.

In fifteenth examples, for any of the fourteenth examples the IC die includes at least one of microprocessor core circuitry or floating point gate array (FPGA) circuitry.

In sixteenth examples, a method of fabricating an integrated circuit (IC) die comprises forming host integrated circuitry comprising plurality of first transistors over a substrate. The host circuitry comprises power supply droop detection circuitry to detect supply voltage droop across power supply rails of the IC die. The method comprises forming one or more first levels of metallization over the first transistors. The method comprises forming a memory array structure over the first levels of metallization. Forming the memory array comprises forming a plurality of second transistors, and forming a plurality of first conductor structures over the second transistors. Individual ones of the first conductor structures are coupled to a terminal of a corresponding one of the second transistors. Forming the array comprises forming ferroelectric material upon a sidewall of the first conductor structures and forming a plurality of second conductors upon a sidewall of the ferroelectric material. The method comprises forming a plurality of second capacitors comprising conductors switchably coupled to the power supply rails. The second capacitors each comprise the ferroelectric material and are to be charged into a first polarization, and discharged into a second opposite polarization in response to supply voltage droop.

In seventeenth examples, for any of the sixteenth examples forming the second capacitors comprises forming the second capacitors over the memory array structure by conformally depositing a first conductor of the second capacitors over a dielectric material having undulating topography.

In eighteenth examples, for any of the sixteenth examples forming the second capacitors comprises forming the second capacitors co-planar with the first capacitors within a region of the IC die proximal to a through-substrate via (TSV).

In nineteenth examples, for any of the sixteenth examples forming the second capacitors comprises etching a via into the substrate, laterally recessing first material layers of the substrate exposed within the via selectively over second material layers of the substrate exposed within the via, and conformally depositing the conductors and the ferroelectric material into the via.

In twentieth examples, for any of the sixteenth examples depositing the ferroelectric material comprises atomic layer deposition of a material comprising predominantly hafnium and oxygen.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should therefore be determined with reference to the appended claims, along with the full scope of equivalents to which such claims are entitled.

What is claimed is:

1. An integrated circuit (IC) die, comprising:
    host circuitry comprising first transistors, wherein the host circuitry comprises power supply droop detection circuitry to detect supply voltage droop across power supply rails of the IC die;
    an embedded memory array structure coupled to the host circuitry, wherein the embedded memory array structure comprises:
        a plurality of first capacitors, each of the first capacitors comprising a first conductor and a second conductor with a ferroelectric material therebetween; and
        a plurality of second transistors, wherein a first terminal of each of the second transistors is connected to the first conductor, a second terminal of the second transistors is coupled to one of a plurality of bitlines, and a third terminal of the second transistors is coupled to one of a plurality of wordlines; and
    a plurality of second capacitors with conductors coupled to the power supply rails.

2. The IC die of claim 1, wherein the second capacitors each comprise the ferroelectric material and are to be charged into a first polarization, and discharged into a second opposite polarization in response to supply voltage droop.

3. The IC die of claim 1, wherein individual ones of the second capacitors are coupled to corresponding ones of third transistors, wherein a first terminal of each of the third transistors is connected to a first conductor of the second capacitors, a second terminal of each of the third transistors is connected to one of the supply rails, a third terminal of each of the third transistors is coupled to the droop detection circuitry and a second conductor of the second capacitors is coupled to another of the supply rails.

4. The IC die of claim 3, wherein the first conductor of the second capacitors is over a dielectric material having undulating topography and first conductor conformally follows the undulating topography.

5. The IC die of claim 1, further comprising one or more first levels of metallization over the first transistors, and wherein:
the memory array structure is over the first levels of metallization;
the plurality of second transistors is between the first capacitors and the first levels of metallization; and
the second capacitors are over the memory array structure.

6. The IC die of claim 1, further comprising one or more first levels of metallization over the first transistors, and wherein:
the memory array structure is over the first levels of metallization;
the plurality of second transistors is between the first capacitors and the first levels of metallization; and
the second capacitors are co-planar with the first capacitors.

7. The IC die of claim 6, wherein the first and second capacitors have substantially the same cylindrical structures.

8. The IC die of claim 1, further comprising:
a substrate under the first transistors; and
a through-substrate via (TSV) extending through the substrate and adjacent to the first and second transistors and adjacent to the first and second capacitors.

9. The IC die of claim 8, wherein the second capacitors are more proximal to the TSV than the first capacitors.

10. The IC die of claim 9, wherein the second capacitors are more proximal to the TSV than the first capacitors.

11. The IC die of claim 10, wherein the ferroelectric material has a relative permittivity over 25 and comprises predominantly Hf, O, and one or impurity dopants that comprise at least one of Si or Ge.

12. The IC die of claim 1, further comprising:
a substrate under the first transistors; and
one or more first levels of metallization over the first transistors, and wherein:
the memory array structure is over the first levels of metallization;
the plurality of second transistors is between the first capacitors and the first levels of metallization; and
the second capacitors are embedded within the substrate.

13. The IC die of claim 1, wherein a channel material of the second transistors comprises predominantly one or more metals and oxygen.

14. A system comprising:
an integrated circuit (IC) die, comprising:
host circuitry comprising first transistors, wherein the host circuitry comprises power supply droop detection circuitry to detect supply voltage droop across power supply rails of the IC die;
an embedded memory array structure coupled to the host circuitry, wherein the embedded memory array structure comprises:
a plurality of first capacitors, each of the first capacitors comprising a first conductor and a second conductor with a ferroelectric material therebetween; and
a plurality of second transistors, wherein a first terminal of each of the second transistors is connected to the first conductor, a second terminal of the second transistors is coupled to one of a plurality of bitlines, and a third terminal of the second transistors is coupled to one of a plurality of wordlines; and
a plurality of second capacitors with conductors switchably coupled to the power supply rails, wherein the second capacitors each comprise the ferroelectric material and are to be charged into a first polarization, and discharged into a second opposite polarization in response to supply voltage droop; and
a power supply coupled to power the IC die.

15. The system of claim 14, wherein:
the IC die includes at least one of microprocessor core circuitry or floating point gate array (FPGA) circuitry.

16. A method of fabricating an integrated circuit (IC) die, the method comprising:
forming host integrated circuitry comprising plurality of first transistors over a substrate, wherein the host integrated circuitry comprises power supply droop detection circuitry to detect supply voltage droop across power supply rails of the IC die;
forming one or more first levels of metallization over the first transistors;
forming a memory array over the first levels of metallization, wherein forming the memory array comprises:
forming a plurality of second transistors;
forming a plurality of first conductor structures over the second transistors, wherein individual ones of the first conductor structures are coupled to a terminal of a corresponding one of the second transistors;
forming ferroelectric material upon a sidewall of the first conductor structures;
forming a plurality of second conductors upon a sidewall of the ferroelectric material; and
forming a plurality of capacitors comprising conductors switchably coupled to the power supply rails, wherein the capacitors each comprise the ferroelectric material and are to be charged into a first polarization, and discharged into a second opposite polarization in response to supply voltage droop.

17. The method of claim 16, wherein forming the capacitors comprises forming the capacitors over the memory array by conformally depositing a first conductor of the capacitors over a dielectric material having undulating topography.

18. The method of claim 16, wherein forming the capacitors comprises forming the capacitors co-planar with second capacitors within a region of the IC die proximal to a through-substrate via (TSV).

19. The method of claim 16, wherein forming the capacitors comprises:
etching a via into the substrate;
laterally recessing first material layers of the substrate exposed within the via selectively over second material layers of the substrate exposed within the via; and
conformally depositing the conductors and the ferroelectric material into the via.

20. The method of claim 16, wherein depositing the ferroelectric material comprises atomic layer deposition of a material comprising predominantly hafnium and oxygen.

* * * * *